(12) United States Patent
Ma et al.

(10) Patent No.: US 12,010,886 B2
(45) Date of Patent: Jun. 11, 2024

(54) DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Hongwei Ma, Beijing (CN); Xiangdan Dong, Beijing (CN); Bo Cheng, Beijing (CN); Mengmeng Du, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 508 days.

(21) Appl. No.: 17/295,559

(22) PCT Filed: Jan. 22, 2020

(86) PCT No.: PCT/CN2020/073909
§ 371 (c)(1),
(2) Date: May 20, 2021

(87) PCT Pub. No.: WO2021/147038
PCT Pub. Date: Jul. 29, 2021

(65) Prior Publication Data
US 2022/0328594 A1 Oct. 13, 2022

(51) Int. Cl.
*H10K 59/131* (2023.01)
*G06F 3/041* (2006.01)
(Continued)

(52) U.S. Cl.
CPC ......... *H10K 59/131* (2023.02); *G06F 3/0412* (2013.01); *H10K 59/122* (2023.02); *H10K 59/40* (2023.02)

(58) Field of Classification Search
CPC .... H10K 59/131; H10K 59/40; H10K 59/122; G06F 3/0412
(Continued)

(56) References Cited

U.S. PATENT DOCUMENTS 7,486,367 B2 * 2/2009 You ................... G02F 1/136227
349/149
7,642,553 B2 * 1/2010 Yoon ..................... G02F 1/1345
349/40

(Continued)

*Primary Examiner* — Eric W Jones
(74) *Attorney, Agent, or Firm* — ArentFox Schiff LLP; Michael Fainberg (57) ABSTRACT

The present disclosure relates to the field of display, and discloses a display panel and a display device. The display panel includes: a base substrate including a first bonding region and a second bonding region; connection terminals located in the bonding regions and including first electric connecting structures and second electric connecting structures which are sequentially stacked, and particularly including first connection terminals and second connection terminals which are respectively located in the first bonding region and the second bonding region; a first insulating layer located between the first electric connecting structures and the second electric connecting structures, not overlapping the first connection terminals, and provided with first openings corresponding to the second connection terminals; and a second insulating layer located on one sides, facing away from the base substrate, of the second electric connecting structures, and provided with second openings corresponding to the connection terminals.

13 Claims, 5 Drawing Sheets

(51) Int. Cl.
*H10K 59/122* (2023.01)
*H10K 59/40* (2023.01)

(58) Field of Classification Search
USPC .................................................... 257/40, 59
See application file for complete search history.

(56) References Cited

U.S. PATENT DOCUMENTS

| | | | | |
|---|---|---|---|---|
| 7,948,173 | B2* | 5/2011 | Choi | H10K 59/131 |
| | | | | 313/506 |
| 8,604,690 | B2* | 12/2013 | Sonoyama | H10K 50/852 |
| | | | | 313/506 |
| 8,853,555 | B2* | 10/2014 | French | H01L 24/05 |
| | | | | 361/767 |
| 8,907,327 | B2* | 12/2014 | Kim | H01L 27/124 |
| | | | | 257/40 |
| 9,504,153 | B2* | 11/2016 | Hwang | H05K 1/0298 |
| 9,633,871 | B2* | 4/2017 | Hatano | H10K 50/8426 |
| 9,721,914 | B2* | 8/2017 | Kang | G02F 1/13458 |
| 10,192,896 | B2* | 1/2019 | Kim | H01L 27/1225 |
| 2020/0212155 | A1* | 7/2020 | Mitani | H10K 77/111 |
| 2021/0295748 | A1* | 9/2021 | Kaneko | H10K 50/844 |

* cited by examiner

DISPLAY PANEL AND DISPLAY DEVICE

This disclosure is a US National Stage of International Application No. PCT/CN2020/073909, filed on Jan. 22, 2020, and entitled "DISPLAY PANEL AND DISPLAY DEVICE", the content of which is hereby incorporated by reference in its entirety.

FIELD

The present disclosure relates to the field of display, in particular to a display panel and a display device.

BACKGROUND

The use of a double-layer source and drain (SD) electrode process on a backplane will increase the laminated structure of a display device, especially in a bonding region, the film structure design has a very obvious impact on the bonding effect. Attendant process problems are what we must consider to deal with, for example, in a flexible printed circuit (FPC) on polyimide (PI) (FOP) region of a flexible substrate, it is common to encounter a corrosion problem of a metal layer of a connection terminal (e.g. pad), that is, in a bonding region of an FPC, due to the bare metal cross-section of the Pad, the Pad is easily corroded sideways, which will influence the bonding effect and yield. In severe cases, the precipitation of metal ions caused by corrosion will cause short circuits in a display region, causing more serious display problems.

SUMMARY

The present disclosure discloses a display panel and a display device, and aims to improve the laminated structure of a bonding region and avoid the occurrence of defects caused by corrosion of connection terminals.

The embodiment of the present disclosure provides a display panel, including:
  a base substrate provided with a display region and a bonding region, where the bonding region is located on one side of the display region, and is divided into a first bonding region and a second bonding region, and the first bonding region is located between the display region and the second bonding region;
  a plurality of connection terminals located in the bonding regions, where each connection terminal includes a first electric connecting structure and a second electric connecting structure which are sequentially stacked on the base substrate, and the plurality of connection terminals include a plurality of first connection terminals located in the first bonding region and a plurality of second connection terminals located in the second bonding region;
  a first insulating layer disposed between a layer where the first electric connecting structure is located and a layer where the second electric connecting structure is located, where an orthographic projection of the first insulating layer on the base substrate does not overlap an orthographic projection of the first connection terminal on the base substrate, the first insulating layer overlaps the second bonding region and is provided with a plurality of first openings corresponding to the plurality of second connection terminals, an orthographic projection of each first opening on the base substrate is disposed within an orthographic projection of the first electric connecting structure of the corresponding second connection terminal on the base substrate, and the first electric connecting structure and the second electric connecting structure of each second connection terminal are connected through the corresponding first opening; and
  a second insulating layer disposed on one side, facing away from the base substrate, of the layer where the second electric connecting structure is located, where the second insulating layer overlaps the bonding region and is provided with a plurality of second openings corresponding to the plurality of connection terminals, and an orthographic projection of each second opening on the base substrate is disposed within an orthographic projection of the second electric connecting structure of the corresponding connection terminal on the base substrate.

Optionally, the first bonding region is a chip bonding region, and the second bonding region is a flexible circuit board bonding region.

Optionally, the display panel further includes first lead wires disposed between the first connection terminals and the second connection terminals, where the first lead wires are disposed on the same layer as the second electric connecting structure; and the second electric connecting structures of the first connection terminals are connected with the second electric connecting structures of the second connection terminals through the first lead wires.

Optionally, the display panel further includes: a first layer of source and drain electrodes located in the display region, where the first layer of source and drain electrodes are disposed between the base substrate and the first insulating layer, and the first electric connecting structures and the first layer of source and drain electrodes are prepared on the same layer; and a second layer of source and drain electrodes located in the display region, wherein the second layer of source and drain electrodes are disposed between the first insulating layer and the second insulating layer, and the second electric connecting structures and the second layer of source and drain electrodes are prepared on the same layer; and the first insulating layer is a passivation layer, and the second insulating layer is a flat layer.

Optionally, the second insulating layer includes a first thinned portion overlapping the first bonding region and a second thinned portion overlapping the second bonding region, a thickness of the first thinned portion of the second insulating layer is smaller than a thickness of a portion surrounding the first thinned portion, and a thickness of the second thinned portion of the second insulating layer is smaller than a thickness of a portion surrounding the second thinned portion.

Optionally, the each connection terminal further includes a third electric connecting structure disposed on the second opening of the second insulating layer, and the third electric connecting structure and the second electric connecting structure of the each connection terminal are connected through the second opening; and the display panel further includes touch electrodes located in the display region, where the touch electrodes are disposed on one side, facing away from the base substrate, of the second insulating layer, and the third electric connecting structures and the touch electrodes are prepared on the same layer.

Optionally, in the second bonding region, orthographic projections of the first electric connecting structure and the second electric connecting structure of each second connection terminal on the base substrate overlap, and the orthographic projections of the first openings on the base substrate overlap the orthographic projections of the second openings on the base substrate.

Optionally, an orthographic projection of the first electric connecting structure and an orthographic projection of the second electric connecting structure of the each connection terminal on the base substrate are disposed within an orthographic projection of the third electric connecting structure of the each connection terminal on the base substrate.

Optionally, the display panel further includes a pixel definition layer disposed between the second insulating layer and a layer where the touch electrodes are located, where the pixel definition layer is located within the display region.

Optionally, the display panel further includes an organic over coating disposed on one side, facing away from the base substrate, of a layer where the touch electrodes are located, where the organic over coating is provided with a third opening exposing the first bonding region and a fourth opening exposing the second bonding region; an orthographic projection of the first thinned portion on the base substrate is located in an orthographic projection of the third opening on the base substrate; and an orthographic projection of the fourth opening on the base substrate is located in an orthographic projection of the second thinned portion on the base substrate.

Optionally, the display panel further includes a third insulating layer disposed between the first insulating layer and a layer where the second layer of source and drain electrodes are located, where the third insulating layer is a flat layer disposed in the display region.

Optionally, the first electric connecting structures and the second electric connecting structures are a titanium/aluminum/titanium laminated structure.

A display device is provided, including the display panel of any one of the embodiments of the present disclosure.

DETAILED DESCRIPTION OF THE EMBODIMENTS

The technical solutions of the embodiments of the present disclosure are described clearly and thoroughly with reference to the accompanying drawings of the embodiments of the present disclosure hereinafter. It is to be understood that the described embodiments are some, but not all, embodiments of the present disclosure. Based on the described embodiments of the present disclosure, all other embodiments attainable by those of ordinary skill in the art without involving any inventive effort are within the scope of the present disclosure.

Figure 1:
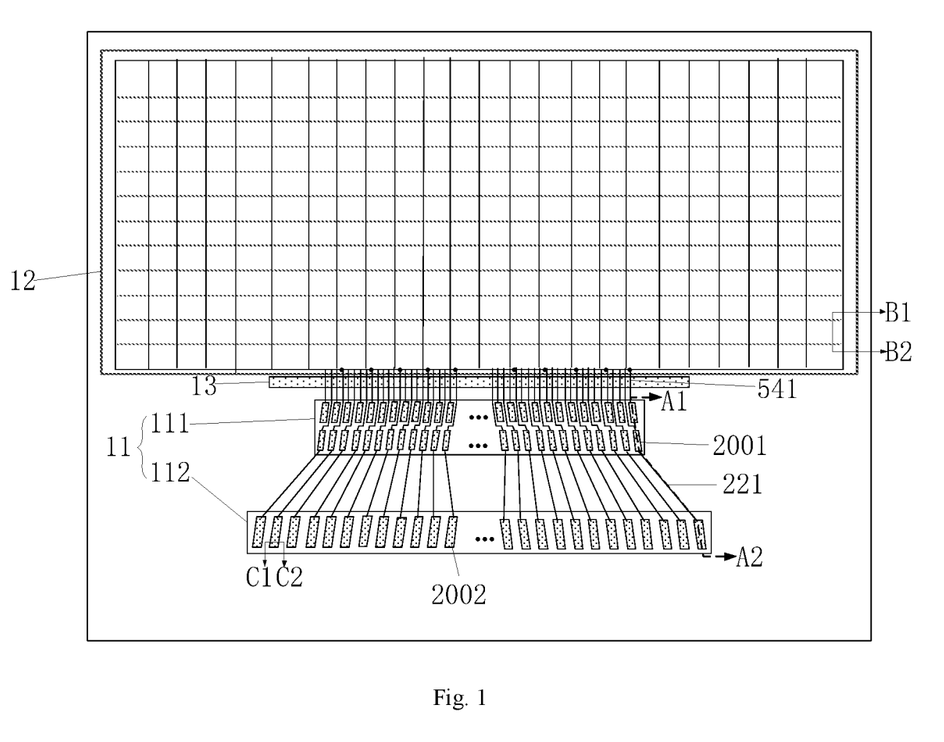
FIG. 1 is a schematic structural diagram of a display panel according to an embodiment of the present disclosure.
Figure 2:
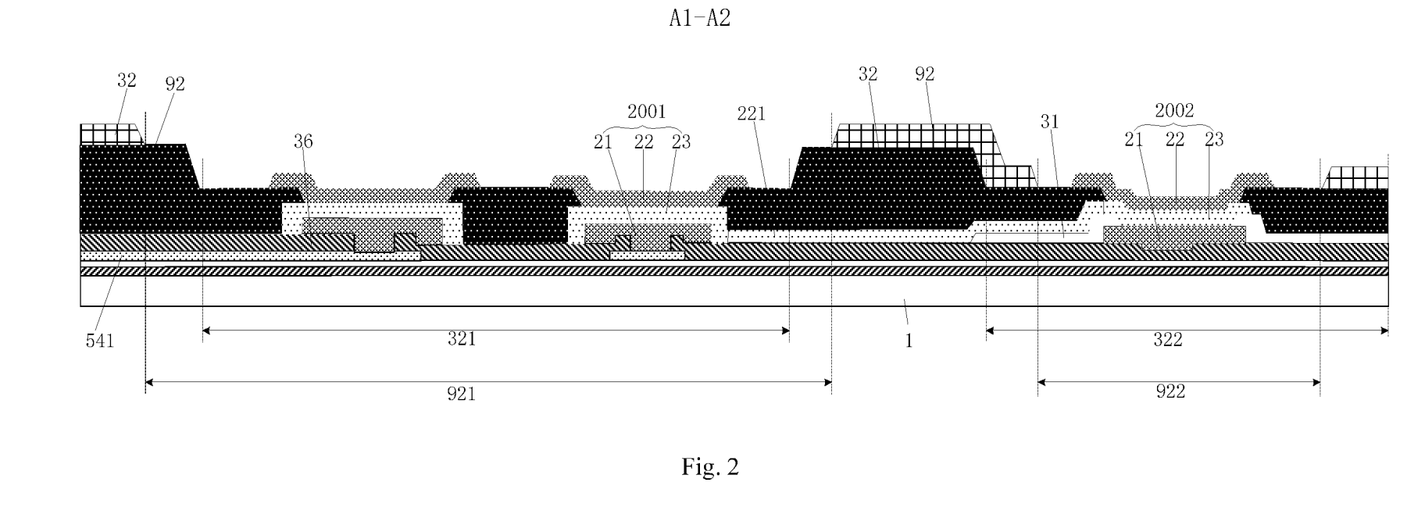
FIG. 2 is a sectional schematic structural diagram of the display panel of FIG. 1 in a direction of A1-A2.
Figure 3:
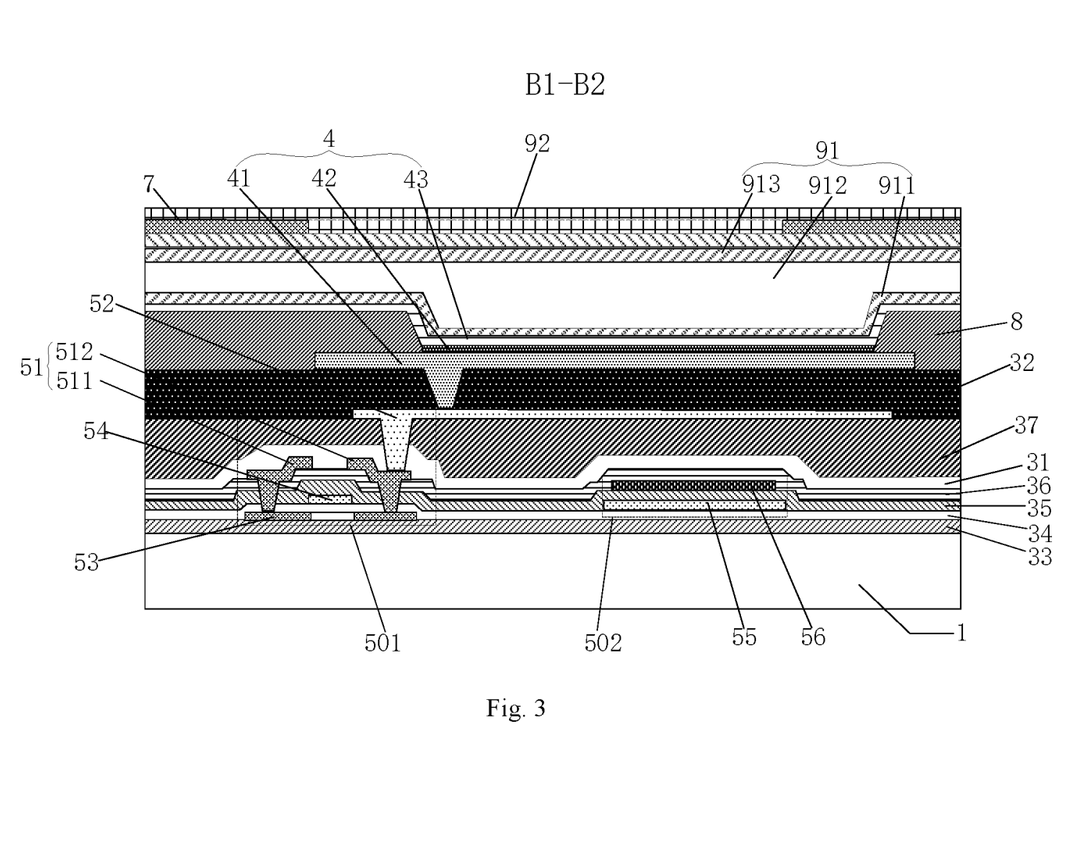
FIG. 3 is a sectional schematic structural diagram of the display panel of FIG. 1 in a direction of B1-B2.
Figure 5:
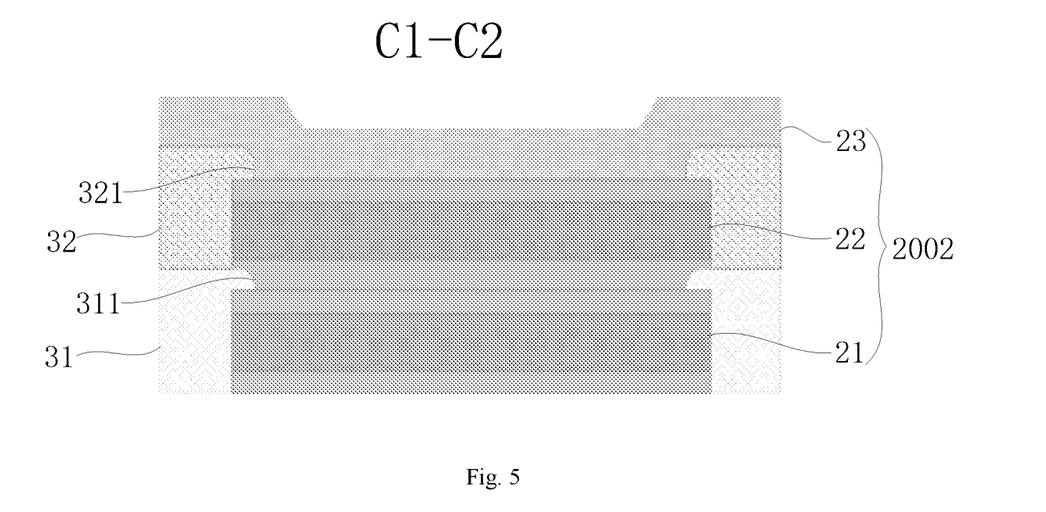
FIG. 5 is a sectional schematic structural diagram of the display panel of FIG. 1 in a direction of C1-C2.

Referring to FIGS. 1 to 5, specifically, sectional diagrams of a display panel of FIG. 1 in directions of A1-A2, B1-B2, and C1-C2 correspond to FIGS. 2, 3, and 5, respectively.

As shown in FIGS. 1 and 2, embodiments of the present disclosure provide a display panel. The display panel includes:

a base substrate 1 provided with a display region 12 and a bonding region 11 disposed on one side of the display region 12, where the bonding region 11 is divided into a first bonding region 111 and a second bonding region 112, and the first bonding region 111 is disposed between the display region 12 and the second bonding region 112;

a plurality of connection terminals located in the bonding region 11, where each connection terminal includes a first electric connecting structure 21 and a second electric connecting structure 22 which are sequentially stacked on the base substrate 1, and the plurality of connection terminals include a plurality of first connection terminals 2001 disposed in the first bonding region 111 and a plurality of second connection terminals 2002 disposed in the second bonding region 112;

a first insulating layer 31 disposed between a layer where the first electric connecting structures 21 are located and a layer where the second electric connecting structures 22 are located, where an orthographic projection of the first insulating layer 31 on the base substrate 1 does not overlap orthographic projections of the first connection terminals 2001 on the base substrate 1, the first insulating layer 31 overlaps the second bonding region 112 and is provided with a plurality of first openings 311 corresponding to the plurality of second connection terminals 2002, an orthographic projection of each first opening 311 on the base substrate 1 is disposed within an orthographic projection of the first electric connecting structure 21 of the corresponding second connection terminal 2002 on the base substrate 1, and the first electric connecting structure 21 and the second electric connecting structure 22 of each second connection terminal 2002 are connected through the corresponding first opening 311; and a second insulating layer 32 disposed on one side, facing away from the base substrate 1, of the layer where the second electric connecting structures 22 are located, where the second insulating layer 32 overlaps the bonding region 11 and is provided with a plurality of second openings 321 corresponding to the plurality of connection terminals (the plurality of first connection terminals 2001 and the plurality of second connection terminals 2002), and an orthographic projection of each second opening 321 on the base substrate 1 is disposed within an orthographic projection of the second electric connecting structure 22 of the corresponding connection terminal on the base substrate 1.

In the above-mentioned display panel, the connection terminals of the bonding region 11 include the layer of first electric connecting structures 21 and the layer of second electric connecting structures 22, the first insulating layer 31 is disposed between the layer where the first electric connecting structures 21 are located and the layer where the second electric connecting structures 22 are located, and the second insulating layer 32 is disposed on the side, facing away from the base substrate 1, of the layer where the second electric connecting structures 22 are located.

Specifically, in the second bonding region 112, the first insulating layer 31 is provided with the first openings 311 to electrically connect the two layers of structures (the first electric connecting structures 21 and the second electric connecting structures 22) of the second connection terminals 2002, and a size of the first openings 311 is smaller than that of the first electric connecting structures 21, that is, the first insulating layer 31 wraps side surfaces of the first electric connecting structures 21 of the second connection terminals 2002, and therefore, it can be ensured that the side surfaces of the first electric connecting structures 21 of the second connection terminals 2002 cannot be corroded in a subsequent preparation process of the display panel; similarly, the second insulating layer 32 is provided with the second openings 41 such that upper portions of the second electric connecting structures 22 of the second connection terminals 2002 are exposed for bonding connection of the connection terminals, or exposed for connection between a subsequently formed third layer of structures (for example, third electric connecting structures 23 mentioned later) of the connection terminals and the two layers of structures below, and the size of the second openings 41 is smaller than an opening size of the second electric connecting structures 22, that is, the second insulating layer 32 wraps side surfaces of the second electric connecting structures 22 of the second connection terminals 2002, and therefore, it can be ensured that the side surfaces of the second electric connecting structures 22 cannot be corroded in the subsequent preparation process. Therefore, the second connection terminals 2002 in the second bonding region 112 are not prone to being corroded, and occurrence of defects due to corrosion of the connection terminals can be avoided.

In the first bonding region 111, an orthographic projection of the first insulating layer 31 does not overlap orthographic projections of the first connection terminals 2001, that is, the first insulating layer 31 does not wrap side surfaces of the first electric connecting structures 21 of the first connection terminals 2001, and the second electric connecting structures 22 of the first connection terminals 2001 directly cover the first electric connecting structures 21; the second insulating layer 32 is provided with the second openings 41 such that upper portions of the second electric connecting structures 22 of the first connection terminals 2001 are exposed for bonding connection of the connection terminals, or connection between a subsequently formed third layer of structures of the connection terminals and the two layers of structures below, and the size of the second openings 41 is smaller than an opening size of the second electric connecting structures 22 of the first connection terminals 2001, that is, the second insulating layer 32 wraps side surfaces of the first connection terminals 2001, and therefore, it can be ensured that side surfaces of the second electric connecting structures 22 cannot be corroded in the subsequent preparation process. Therefore, the first connection terminals 2001 in the first bonding region 111 are not prone to being corroded, either, and occurrence of defects due to corrosion of the connection terminals can be avoided. Meanwhile, since the orthographic projection of the first insulating layer 31 does not overlap the orthographic projections of the first connection terminals 2001, that is, the first insulating layer 31 does not wrap edges of the first electric connecting structures 21 of the first connection terminals 2001, and the second electric connecting structures 22 of the first connection terminals 2001 directly cover the first electric connecting structures 21, a height difference of the first connection terminals 2001 is small, thereby being more suitable for bonding highly requiring a height difference of connection terminals, for example, bonding of integrated circuit chips.

In summary, the display panel of the present disclosure includes the first bonding region 111 and the second bonding region 112, and the side surfaces of the connection terminals in the first bonding region 111 and the second bonding region 112 are all wrapped and protected, so that the problem of corrosion of the connection terminals is not easy to occur, defects (such as poor bonding contact or poor short circuit) caused by corrosion of the side surfaces of the connection terminals (such as lateral corrosion of the connection terminals in a subsequent anode wet etching process) can be avoided, and the yield of the display panel is improved. Moreover, according to different bonding process requirements, the first connection terminals 2001 in the first bonding region 111 and the second connection terminals 2002 in the second bonding region 112 are different in both film design and height difference, so as to be suitable for bonding connection with different height difference requirements, and the yield of the bonding connection is improved.

In a specific embodiment, as shown in FIG. 1, the first bonding region 111 is a chip bonding region, e.g. a chip on polyimide (COP) region, and the second bonding region 112 is a flexible circuit board bonding region, e.g., a flexible printed circuit on polyimide (FOP) region.

Specifically, a pitch of connection terminals (e.g. pads) of the FOP region is large and requirements on a height difference of the pads are not high, so that the second bonding region 112 is suitably configured as the FOP region. A pitch of pads of the COP region is small and requirements on a height difference of the pads are high, so that the first bonding region 111 is suitably configured as the COP region.

In a specific embodiment, as shown in FIGS. 1 and 2, the display panel further includes first lead wires 221 disposed between the first connection terminals 2001 and the second connection terminals 2002. The first lead wires 221 are disposed on the same layer as the second electric connecting structures 22, where 'being disposed on the same layer' means that it is possible to form in the same layer in a manufacturing process, e.g. forming by a patterning process with the same material layer.

The second electric connecting structures 22 of the first connection terminals 2001 and the second electric connecting structures 22 of the second connection terminals 2002 are connected through the first lead wires 221.

In a specific embodiment, as shown in FIG. 3, the display panel further includes a first layer of source and drain electrodes 51 and a second layer of source and drain electrodes 52 (lapping electrode layers) disposed in the display region. Specifically, the first layer of source and drain electrodes 51 are disposed between the base substrate 1 and the first insulating layer 31, and the second layer of source and drain electrodes 52 are disposed between the first insulating layer 31 and the second insulating layer 32. As shown in FIGS. 2 and 3, the first electric connecting structures 21 are prepared on the same layer as the first layer of source and drain electrodes 51, and the second electric connecting structures 22 are prepared on the same layer as the second layer of source and drain electrodes 52.

Specifically, the first insulating layer 31 is a passivation layer (PVX) and is mainly configured to insulate the first layer of source and drain electrodes 51 from the second layer of source and drain electrodes 52, and also configured to protect the first layer of source and drain electrodes 51; and the second insulating layer 32 is a flat layer that functions as a flat layer and protects underlying metal electrodes and traces.

As shown in FIGS. 1 and 3, the display panel provided by an embodiment of the present disclosure includes a plurality of pixel structures located in the display region 12, where the pixel structures include pixel driving circuits, the pixel driving circuits may include thin film transistors 501, storage capacitors 502 and the like. Specifically, the pixel driving circuits may include active layers 53, a first gate insulating layer 34, gate electrodes 54, first capacitance electrodes 55, a second gate insulating layer 35, second capacitance electrodes 56, an interlayer insulating layer 36, the first layer of source and drain electrodes 51 (including source electrodes 511 and drain electrodes 512), the first insulating layer (passivation layer) 31, the second layer of source and drain electrodes 52, and the second insulating layer (flat layer) 32 which are sequentially disposed on a buffer layer 33.

Specifically, as shown in FIGS. 2 and 3, the gate electrodes 54 can be disposed on the same layer as second lead wires 541, where the second lead wires 541 are disposed between the display region and the first bonding region; the first layer of source and drain electrodes 51 can be disposed on the same layer as the first electric connecting structures 21 in the bonding region; the second layer of source and drain electrodes 52 can be disposed on the same layer as the second electric connecting structures 22 in the bonding region and the first lead wires 221; the second gate insulating layer 35 extends into the bonding region so as to protect the second lead wires 541 against corrosion; the first insulating layer 31 is configured as the passivation layer, extends into the first bonding region 111 and wraps the side surfaces of the first electric connecting structures 21 so as to protect the side surfaces of the first electric connecting structures 21 against corrosion; and the second insulating layer 32 is configured as the flat layer and extends into the first bonding region 111 and the second bonding region 112 to protect the first lead wires 221 and the side surfaces of the second electric connecting structures 22 of the connection terminals against corrosion.

An embodiment of the present disclosure is a double-layer source and drain (SD) electrode driving panel, where connection terminals are provided with two layers of structures (first electric connecting structures 21 and second electric connecting structures 22) which are prepared on the same layer as double-layer source and drain electrodes (SD), so that a thickness of the connection terminals can be increased, a resistance is reduced, that is, a resistance drop (IR Drop) is reduced, the attenuation of signals is reduced, and the display uniformity is improved. Specifically, a back plane of the double-layer source and drain electrodes (SD) requires the addition of two to three mask processes relative to a back plane of a conventional single-layer source and drain (SD) electrode, and a film stack structure is relatively complicated.

Figure 4A:
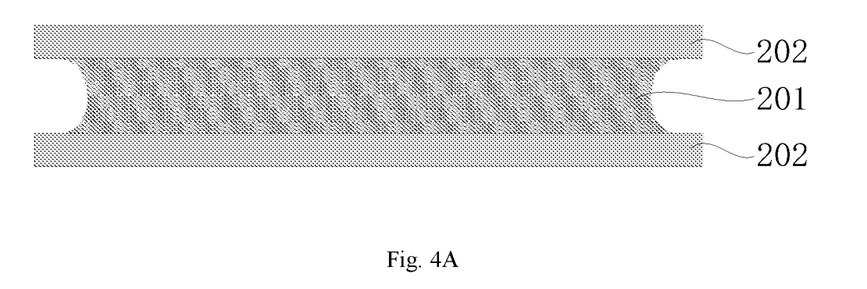
FIG. 4A is a sectional schematic structural diagram illustrating a case where a part of the structure of connection terminals of the display panel is corroded, according to an embodiment of the present disclosure.
Figure 4B:
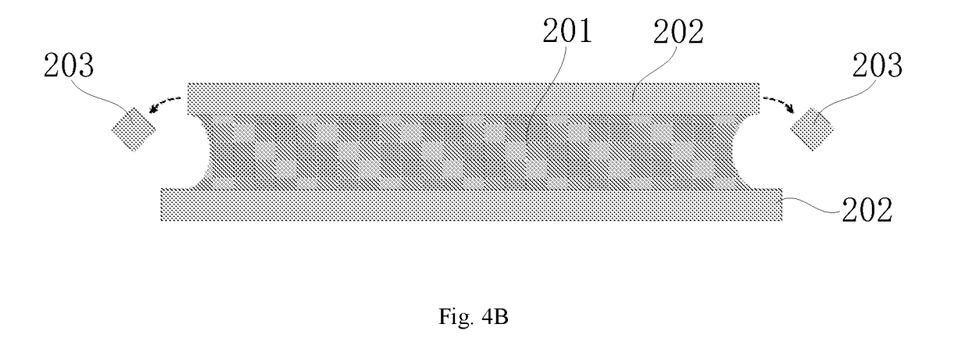
FIG. 4B is a sectional schematic structural diagram illustrating a case where a part of the structure of the connection terminals of the display panel is corroded to produce a bad condition, according to an embodiment of the present disclosure.

Illustratively, as shown in FIGS. 4A and 4B, the first electric connecting structures 21 and the second electric connecting structures 22 are of the same material as the source and drain electrodes, namely, a titanium/aluminum/titanium (Ti/Al/Ti) composite material, which includes two titanium material layers 202 and an aluminum material layer 201 disposed between the two titanium material layers 202, thereby forming a titanium/aluminum/titanium (Ti/Al/Ti) laminated structure.

Specifically, as shown in FIG. 4A, when a side surface of an electric connecting structure is exposed, the aluminum material layer 201 in the middle of the electric connecting structure is easily corroded sideways, resulting in suspension of the titanium material layer 202 of a top layer. As shown in FIG. 4B, an edge of the titanium material layer 202 of a top layer is easily peeled off in a later high-voltage process, resulting in metal particles 203, and if these peeled metal particles 203 remain at signal lines, a short will occur, resulting in poor display. As shown in FIGS. 2 and 5, according to the display panel of the present disclosure, for the second connection terminals 2002 in the second bonding region, the side surfaces of the first electric connecting structures 21 are wrapped and protected by the first insulating layer 31, and the side surfaces of the second electric connecting structures 22 are wrapped and protected by the second insulating layer 32, thereby effectively avoiding the occurrence of defects caused by corrosion; and for the first connection terminals 2001 in the first bonding region, the side surfaces of the first electric connecting structures 21 are wrapped and protected by the second electric connecting structures 22, and the side surfaces of the second electric connecting structures 22 are wrapped and protected by the second insulating layer 32, thereby also effectively avoiding the occurrence of defects caused by corrosion.

In a specific embodiment, as shown in FIG. 3, the display panel of an embodiment of the present disclosure may further include a third insulating layer 37 disposed between the first insulating layer 31 and the second layer of source and drain electrodes 52, where the third insulating layer 37 is a flat layer and is disposed within the display region 12.

Specifically, the third insulating layer 37 is an organic flat layer mainly functioning as a flat layer and protecting the first layer of source and drain electrodes 51.

As shown in FIGS. 2 and 3, the passivation layer (the first insulating layer 31) and the organic flat layer (the third insulating layer 37) are disposed between the first layer of source and drain electrodes 51 and the second layer of source and drain electrodes 52; and a thickness of the passivation layer (the first insulating layer 31) is smaller than that of the organic flat layer (the third insulating layer 37). In the present disclosure, using the passivation layer (the first insulating layer 31) to protect the first electric connecting structures 21 of the second connection terminals 2002, instead of the organic flat layer (the third insulating layer 37), may avoid influences on bonding of the second connection terminals 2002 caused by a large edge thickness of the second connection terminals 2002. In addition, the third insulating layer (the organic flat layer) 37 is only disposed in the display region 12 and does not cover the bonding region 11, thereby further avoiding influences on bonding caused by an excessively large insulating layer thickness of the bonding region 11, and greatly relieving the problem of module bonding caused by film stack complexity of the double SD.

Specifically, as shown in FIG. 2, the passivation layer (the first insulating layer 31) covers the second bonding region and wraps the edges of the second connection terminals 2002, and at the same time, the passivation layer (the first insulating layer 31) does not overlap the first bonding region, and neither covers the first bonding region nor wraps the edges of the first connection terminals 2001, so that the requirements of the COP region and the FOP region for the film thickness and the height difference of the connection terminals are matched as much as possible and the bonding yield is improved.

In a specific embodiment, as shown in FIG. 1, in the display panel of the present disclosure, the base substrate 1 may further include a bending region 13 disposed between the first bonding region 111 and the display region 12, the second lead wires 541 span the bending region 13, and two ends of the second lead wires 541 are electrically connected to the pixel driving circuits of the display region 12 and the first connection terminals 2001 of the first bonding region 111, respectively; and after bonding, the base substrate 1 may be bent along the bending region 13 to bend the bonding region 11 to a back side of the display panel.

Specifically, the first insulating layer (the passivation layer) 31 is not disposed in the bending region 13, that is, the first insulating layer (the passivation layer) 31 does not cover the bending region 13, so that the bending stress and the bending radius are reduced, the bending operation of the display panel is easier, and undesirable problems such as film or wiring breakage do not occur in the bending region 13.

In a specific embodiment, as shown in FIGS. 1 and 2, the second insulating layer 32 includes a first thinned portion 321 overlapping the first bonding region 111 and a second thinned portion 322 overlapping the second bonding region 112. As shown in FIG. 2, a thickness of the first thinned portion 321 of the second insulating layer 32 is smaller than a thickness of a portion surrounding the first thinned portion 321, and a thickness of the second thinned portion 322 of the second insulating layer 32 is smaller than a thickness of a portion surrounding the second thinned portion 322, that is, portions, within the first bonding region 111 and the second bonding region 112, of the second insulating layer 32 are thinned. The second insulating layer 32 is an organic layer functioning as flattening and protecting, and generally has a large thickness, thinning the second insulating layer 32 in the bonding region 11 can effectively reduce the influence of the thickness of the second insulating layer 32 on bonding, thereby not only protecting the side surfaces of the connection terminals, but also greatly relieving the problem of module bonding caused by the film stack complexity of the double SD.

Specifically, a Halftone process may be employed such that the thickness of the second insulating layer in the first bonding region and the second bonding region is less than those of surrounding portions, thereby thinning the second insulating layer in the first bonding region and the second bonding region.

In a specific embodiment, as shown in FIGS. 2 and 5, the connection terminals further include third electric connecting structures 23 disposed on the second openings 321 of the second insulating layer 32, and the third electric connecting structure 23 and the second electric connecting structure 22 of each connection terminal are connected through the corresponding second opening 321.

Specifically, as shown in FIGS. 1 to 3, the display panel further includes touch electrodes 7 disposed in the display region 12, where the touch electrodes 7 are disposed on one side, facing away from the base substrate 1, of the second insulating layer 32, and the third electric connecting structures 23 are prepared on the same layer as the touch electrodes 7.

According to the display panel disclosed by the embodiments of the present disclosure, a flexible multi layer on cell touch (FMLOC) technology is adopted, and a touch sensor is formed through a film deposition process.

Specifically, as shown in FIG. 2, the first electric connecting structures 21, the second electric connecting structures 22 and the third electric connecting structures 23 are simultaneously integrated in the connection terminals of the embodiments of the present disclosure, which can be used for transmission connection of display signals and transmission connection of touch signals. For example, as shown in FIGS. 1 to 3, among all the connection terminals of the embodiments of the present disclosure, a part of the connection terminals are used as connection terminals for the display signals, and the second lead wires 541 connected to those connection terminals are electrically connected to the first layer of source and drain electrodes 51 in the display region 12 without being electrically connected to the touch electrodes 7; and further, the other part of the connection terminals are used as connection terminals for the touch signals, the second lead wires 541 connected to those connection terminals are electrically connected to the touch electrodes 7 in the display region 12 without being electrically connected to the double-layer source and drain electrodes (51 and 52). Illustratively, connection between the second lead wires 541 and the electrodes of the different layers may be achieved through via holes in the interlayer insulating layer.

In a specific embodiment, as shown in FIGS. 2 and 5, in the second bonding region, the orthographic projections of the first electric connecting structures 21 and the second electric connecting structures 22 of the second connection terminals 2002 on the base substrate 1 overlap, and the orthographic projections of the first openings 311 on the base substrate 1 and the orthographic projections of the second openings 41 on the base substrate 1 overlap. According to the arrangement, the connection terminals can be conveniently miniaturized, and the contact yield of each layer of the connection terminals is guaranteed.

Illustratively, as shown in FIGS. 2 and 5, the orthographic projections of the first electric connecting structures 21 and the second electric connecting structures 22 on the base substrate 1 are disposed within orthographic projections of the third electric connecting structures 23 on the base substrate 1, that is, the third electric connecting structures 23 completely cover the first electric connecting structures 21 and the second electric connecting structures 22, so that a bonding contact area of the connection terminals 2 is increased, and the bonding yield is increased.

In a specific embodiment, as shown in FIGS. 1 and 3, the display panel further includes a pixel definition layer (PDL) 8 disposed between the second insulating layer 32 and a layer where the touch electrodes 7 are disposed. The pixel definition layer 8 (organic layer) is only within the display region 12 and does not cover the bonding region 11, so that the insulating layer thickness of the bonding region 11 is further prevented from being too large to influence bonding, and the problem of module bonding caused by film stack complexity of the double SD can be greatly relieved.

Specifically, as shown in FIG. 3, light-emitting elements 4 are further disposed in the display region of the base substrate 1, and the light-emitting elements 4 are formed on the pixel driving circuits, that is, the light-emitting elements 4 are disposed on one side, away from the base substrate 1, of the second insulating layer (the flat layer) 32. Each light-emitting element 4 includes a first electrode 41, a light-emitting layer 42, and a second electrode 43. The first electrodes 41 of the light-emitting elements 4 are electrically connected to the second layer of source and drain electrodes (the lapping electrode layers) 52 through via holes in the second insulating layer (the flat layer) 32. The pixel definition layer 8 is disposed on the first electrodes 41, the pixel definition layer 8 includes a plurality of openings for defining a plurality of pixel cells, each opening exposes one first electrode 41, and the light-emitting layers 42 are disposed in the plurality of openings of the pixel definition layer 8. The second electrodes 43 may be disposed in a part or the whole of the display region, so that the second electrodes 43 may be integrally formed in the manufacturing process.

Further, as shown in FIG. 3, the light-emitting elements 4 are further provided with encapsulation layers 91. Each encapsulation layer 91 includes a first organic layer 911, an inorganic layer 912, and a second organic layer 913. The encapsulation layers 91 do not cover the bonding region, i.e., not overlapping the bonding region. Specifically, the touch electrodes 7 are disposed on one side, facing away from the base substrate 1, of the encapsulation layers 91.

Further, as shown in FIGS. 2 and 3, the display panel may further include an organic over coating (OC) 92 disposed on one side, facing away from the base substrate 1, of the layer where the touch electrodes 7 are disposed. As shown in FIGS. 1 and 2, the organic over coating 92 is provided with a third opening 921 exposing the first bonding region 111 and a fourth opening 922 exposing the second bonding region 112.

The organic over coating is provided with the openings for avoiding the first bonding region and the second bonding region, that is, the organic over coating does not cover the first bonding region and the second bonding region, so that the thickness of the insulating layer in the bonding region is prevented from being too large to influence bonding. In addition, the organic over coating only avoids the bonding region, but covers other regions, thereby having a good protection effect on underlying metal wiring.

Specifically, as shown in FIG. 2, an orthographic projection of the first thinned portion 321 of the second insulating layer 32 on the base substrate 1 is disposed within an orthographic projection of the third opening 921 of the organic over coating 92 on the base substrate 1, and an orthographic projection of the fourth opening 922 of the organic over coating 92 on the base substrate 1 is disposed within an orthographic projection of the second thinned portion 322 of the second insulating layer 32 on the base substrate 1. That is, in the first bonding region (COP region), an opening boundary (a boundary of the fourth opening 922) of the organic over coating 92 surrounds an edge of a thinned region (an edge of the second thinned portion 322) of the second insulating layer 32, and in the second bonding region (FOP region), an edge of a thinned region (an edge of the first thinned portion 321) of the second insulating layer 32 surrounds an opening boundary (a boundary of the third opening 921) of the organic over coating 92.

Certainly, the actual product is not limited to the above case, and in an actual display panel product, it is also possible that in the FOP region, the opening boundary (the boundary of the third opening 921) of the organic over coating 92 surrounds the edge of the thinned region (the edge of the first thinned portion 321) of the second insulating layer 32, and in the COP region, the edge of the thinned region (the edge of the second thinned portion 322) of the second insulating layer 32 surrounds the opening boundary (the boundary of the fourth opening 922) of the organic over coating 92.

Specifically, the display panel in the embodiments of the present disclosure may be a flexible active-matrix organic light-emitting diode (AMOLED) display panel, where the base substrate is a flexible base and includes double-layer polyimide (PI) and an inorganic layer disposed in the middle of the double-layer PI; and alternatively, the display panel of the embodiments of the present disclosure may be a rigid panel, where the base substrate is glass.

In addition, an embodiment of the present disclosure provides a display device including the display panel of any one of the embodiments of the present disclosure as described the above.

The display device provided by the embodiments of the present disclosure has the same beneficial effects as the display panel of the embodiments of the present disclosure, and is not described in detail herein.

It will be apparent to those skilled in the art that various modifications and variations can be made in the disclosed embodiments without departing from the spirit or scope of the disclosure. Thus, it is intended that the present disclosure covers the modifications and variations of this disclosure provided they come within the scope of the appended claims and their equivalents.

What is claimed is:

1. A display panel, comprising:
a base substrate, comprising a display region and a bonding region, wherein the bonding region is located on a side of the display region and is divided into a first bonding region and a second bonding region, wherein the first bonding region is located between the display region and the second bonding region;
a plurality of connection terminals, located in the bonding region, wherein each connection terminal comprises a first electric connecting structure and a second electric connecting structure which are sequentially stacked on the base substrate, and the plurality of connection terminals comprise a plurality of first connection terminals located in the first bonding region and a plurality of second connection terminals located in the second bonding region;
a first insulating layer disposed between a layer where the first electric connecting structure is located and a layer where the second electric connecting structure is located, wherein an orthographic projection of the first insulating layer on the base substrate does not overlap an orthographic projection of the first connection terminal on the base substrate, the first insulating layer overlaps the second bonding region and is provided with a plurality of first openings corresponding to the plurality of second connection terminals, an orthographic projection of each first opening on the base substrate is disposed within an orthographic projection of the first electric connecting structure of the corresponding second connection terminal on the base substrate, and the first electric connecting structure and the second electric connecting structure of each second connection terminal are connected through the corresponding first opening; and
a second insulating layer disposed on a side, facing away from the base substrate, of the layer where the second electric connecting structure is located, wherein the second insulating layer overlaps the bonding region and is provided with a plurality of second openings corresponding to the plurality of connection terminals, and an orthographic projection of each second opening on the base substrate is disposed within an orthographic projection of the second electric connecting structure of the corresponding connection terminal on the base substrate.

2. The display panel according to claim 1, wherein the first bonding region is a chip bonding region and the second bonding region is a flexible circuit board bonding region.

3. The display panel according to claim 1, further comprising first lead wires disposed between the first connection terminals and the second connection terminals, wherein the first lead wires are disposed on the same layer as the second electric connecting structure; and
the second electric connecting structures of the first connection terminals are connected with the second electric connecting structures of the second connection terminals through the first lead wires.

4. The display panel according to claim 1, further comprising:
a first layer of source and drain electrodes located in the display region and disposed between the base substrate and the first insulating layer, wherein the first electric connecting structures and the first layer of source and drain electrodes are prepared on the same layer; and
a second layer of source and drain electrodes located in the display region and disposed between the first insulating layer and the second insulating layer, wherein the second electric connecting structures and the second layer of source and drain electrodes are prepared on the same layer;
wherein the first insulating layer is a passivation layer, and the second insulating layer is a flat layer.

5. The display panel according to claim 4, wherein the second insulating layer comprises a first thinned portion overlapping the first bonding region and a second thinned portion overlapping the second bonding region, wherein a thickness of the first thinned portion of the second insulating layer is smaller than a thickness of a portion surrounding the first thinned portion, and a thickness of the second thinned portion of the second insulating layer is smaller than a thickness of a portion surrounding the second thinned portion.

6. The display panel according to claim 5, wherein the each connection terminal further comprises a third electric connecting structure disposed on the second opening of the second insulating layer, wherein the third electric connecting structure and the second electric connecting structure of the each connection terminal are connected through the second opening; and
the display panel further comprises touch electrodes located in the display region and disposed on a side, facing away from the base substrate, of the second insulating layer, and the third electric connecting structures and the touch electrodes are prepared on the same layer.

7. The display panel according to claim 6, wherein in the second bonding region, orthographic projections of the first electric connecting structure and the second electric connecting structure of each second connection terminal on the base substrate overlap, and the orthographic projections of the first openings on the base substrate overlap the orthographic projections of the second openings on the base substrate.

8. The display panel according to claim 6, wherein an orthographic projection of the first electric connecting structure and an orthographic projection of the second electric connecting structure of the each connection terminal on the base substrate are disposed within an orthographic projection of the third electric connecting structure of the each connection terminal on the base substrate.

9. The display panel according to claim 6, further comprising a pixel definition layer disposed between the second insulating layer and a layer where the touch electrodes are located, wherein the pixel definition layer is located within the display region.

10. The display panel according to claim 6, further comprising an organic over coating disposed on a side, facing away from the base substrate, of a layer where the touch electrodes are located, wherein the organic over coating is provided with a third opening exposing the first bonding region and a fourth opening exposing the second bonding region;
an orthographic projection of the first thinned portion on the base substrate is located in an orthographic projection of the third opening on the base substrate; and
an orthographic projection of the fourth opening on the base substrate is located in an orthographic projection of the second thinned portion on the base substrate.

11. The display panel according to claim 4, further comprising a third insulating layer disposed between the first insulating layer and a layer where the second layer of source and drain electrodes are located, wherein the third insulating layer is a flat layer disposed in the display region.

12. The display panel according to claim 4, wherein the first electric connecting structures and the second electric connecting structures are a titanium/aluminum/titanium laminated structure.

13. A display device, comprising a display panel according to, wherein the display panel comprises:
a base substrate, comprising a display region and a bonding region, wherein the bonding region is located on a side of the display region and is divided into a first bonding region and a second bonding region, wherein the first bonding region is located between the display region and the second bonding region;
a plurality of connection terminals, located in the bonding region, wherein each connection terminal comprises a first electric connecting structure and a second electric connecting structure which are sequentially stacked on the base substrate, and the plurality of connection terminals comprise a plurality of first connection terminals located in the first bonding region and a plurality of second connection terminals located in the second bonding region;
a first insulating layer disposed between a layer where the first electric connecting structure is located and a layer where the second electric connecting structure is located, wherein an orthographic projection of the first insulating layer on the base substrate does not overlap an orthographic projection of the first connection terminal on the base substrate, the first insulating layer overlaps the second bonding region and is provided with a plurality of first openings corresponding to the plurality of second connection terminals, an orthographic projection of each first opening on the base substrate is disposed within an orthographic projection of the first electric connecting structure of the corresponding second connection terminal on the base substrate, and the first electric connecting structure and the second electric connecting structure of each second connection terminal are connected through the corresponding first opening; and
a second insulating layer disposed on a side, facing away from the base substrate, of the layer where the second electric connecting structure is located, wherein the second insulating layer overlaps the bonding region and is provided with a plurality of second openings corresponding to the plurality of connection terminals, and an orthographic projection of each second opening on the base substrate is disposed within an orthographic projection of the second electric connecting structure of the corresponding connection terminal on the base substrate.

\* \* \* \* \*